US012804798B2

(12) United States Patent
Nasr et al.

(10) Patent No.: US 12,804,798 B2
(45) Date of Patent: Nov. 17, 2026

(54) COLD PLATE HAVING OPENING AND RELATED SYSTEMS

(71) Applicant: Tesla, Inc., Austin, TX (US)

(72) Inventors: Mohamed Haitham Helmy Nasr, Sunnyvale, CA (US); Samuel Lichy, San Jose, CA (US); Aydin Nabovati, Toronto (CA); Rishabh Bhandari, San Carlos, CA (US); Yong guo Li, Gilroy, CA (US); Zheng Gao, Sunnyvale, CA (US)

(73) Assignee: Tesla, Inc., Austin, TX (US)

( * ) Notice: Subject to any disclaimer, the term of this patent is extended or adjusted under 35 U.S.C. 154(b) by 184 days.

(21) Appl. No.: 18/683,754

(22) PCT Filed: Aug. 16, 2022

(86) PCT No.: PCT/US2022/040419

§ 371 (c)(1),
(2) Date: Feb. 14, 2024

(87) PCT Pub. No.: WO2023/023024

PCT Pub. Date: Feb. 23, 2023

(65) Prior Publication Data

US 2024/0357729 A1 Oct. 24, 2024

Related U.S. Application Data

(60) Provisional application No. 63/260,387, filed on Aug. 18, 2021.

(51) Int. Cl.

*H05K 1/02* (2006.01)
*H05K 1/18* (2026.01)
*H05K 1/181* (2026.01)

(52) U.S. Cl.

CPC .......... *H05K 1/0204* (2013.01); *H05K 1/181* (2013.01); *H05K 2201/064* (2013.01); *H05K 2201/066* (2013.01)

(58) Field of Classification Search

CPC ....... H05K 1/0203–0204; H05K 1/181; H05K 7/023; H05K 7/1489; H05K 7/20;
(Continued)

(56) References Cited

U.S. PATENT DOCUMENTS 4,551,787 A * 11/1985 Mittal ................ H01L 23/3672 257/E23.098
4,961,709 A 10/1990 Noschese
(Continued)

FOREIGN PATENT DOCUMENTS

CN 104285151 1/2015
CN 208506478 U 2/2019
(Continued)

OTHER PUBLICATIONS

Chun, Shu-Rong, et al. “InFO SoW (System-on-Wafer) for High Performance Computing.” *2020 IEEE 70th Electronic Components and Technology Conference* (*ECTC*). IEEE, Jun. 1, 2020.
(Continued)

*Primary Examiner* — Amir A Jalali
(74) *Attorney, Agent, or Firm* — Knobbe, Martens, Olson & Bear, LLP

(57) ABSTRACT

Electronic assemblies with a cold plate having an opening are provided. In one aspect, a system includes an array of electronic components, a control board, and a cold plate having a plurality of openings therethrough. The cold plate can be arranged between the array of electronic components and the control board. The cold plate can cool the array of electronic components. The system can also include a plurality of pass through connectors arranged in the openings in
(Continued)

the cold plate and configured to connect the array of electronic components to the control board. The cold plate can also be used to cool the control board electronics and the connectors passing through.

21 Claims, 16 Drawing Sheets

(58) Field of Classification Search
CPC ........... H05K 7/29254; H05K 7/20281; H05K 7/20454; H05K 7/20509; H05K 2201/064; H05K 2201/066; H01L 23/34; H01L 23/367; H01L 23/3736; H01L 23/40; H01L 23/427; H01L 23/473; H01L 2225/06589; H01L 21/4882; H01L 24/29; H01L 24/32; H01L 24/33; H01L 25/0655; G06F 1/20; G06F 2200/1635; F28D 1/0443
See application file for complete search history.

(56) References Cited

U.S. PATENT DOCUMENTS

| | | | | |
|---|---|---|---|---|
| 5,014,904 | A * | 5/1991 | Morton | H05K 7/205 228/123.1 |
| 5,983,997 | A | 11/1999 | Hou | |
| 6,058,010 | A * | 5/2000 | Schmidt | H05K 7/1422 361/689 |
| 6,677,772 | B1 | 1/2004 | Faull | |
| 7,520,754 | B1 | 4/2009 | Gattuso | |
| 7,719,850 | B2 | 5/2010 | Duerbaum et al. | |
| 7,990,711 | B1 * | 8/2011 | Andry | H01L 23/3677 165/80.4 |
| 8,542,488 | B2 * | 9/2013 | Peterson | G06F 1/20 361/699 |
| 8,723,540 | B2 | 5/2014 | Yamamoto | |
| 8,897,013 | B2 * | 11/2014 | Sharaf | H05K 7/20509 361/720 |
| 9,373,900 | B2 | 6/2016 | Yamada | |
| 9,844,144 | B1 * | 12/2017 | Al-Momani | H05K 3/325 |
| 10,164,361 | B2 | 12/2018 | Minich | |
| 10,656,179 | B2 | 5/2020 | Ota | |
| 10,765,038 | B1 | 9/2020 | Leigh et al. | |
| 10,785,871 | B1 * | 9/2020 | Vinciarelli | H05K 1/116 |
| 2012/0164888 | A1 | 6/2012 | Rathburn | |
| 2012/0212175 | A1 | 8/2012 | Sharaf et al. | |
| 2013/0181585 | A1 * | 7/2013 | Zhu | H05K 7/20254 312/236 |
| 2014/0162471 | A1 | 6/2014 | Hwang et al. | |
| 2014/0194011 | A1 | 7/2014 | Hatch | |
| 2020/0119481 | A1 | 4/2020 | Struyk | |
| 2020/0286858 | A1 * | 9/2020 | Fricker | H10W 70/635 |
| 2021/0080486 | A1 | 3/2021 | Audette et al. | |
| 2022/0142013 | A1 * | 5/2022 | Zhou | F28F 3/12 361/702 |
| 2022/0294162 | A1 | 9/2022 | Narumi | |
| 2022/0386509 | A1 * | 12/2022 | Zhou | H05K 7/209 |
| 2024/0061482 | A1 | 2/2024 | Krithivasan et al. | |
| 2024/0356255 | A1 | 10/2024 | Bhandari et al. | |

FOREIGN PATENT DOCUMENTS

| | | |
|---|---|---|
| CN | 111403941 | 7/2020 |
| DE | 102011078133 | 12/2011 |
| JP | 64-24447 | 1/1989 |
| JP | 06-342600 | 12/1994 |
| JP | 07-335353 | 12/1995 |
| JP | 10-125426 | 5/1998 |
| JP | 11-121668 | 4/1999 |
| JP | 2006-098254 | 4/2006 |
| JP | 2008-112967 | 5/2008 |
| KR | 10-1532817 | 6/2015 |
| WO | WO 2020/061330 | 3/2020 |

OTHER PUBLICATIONS

International Search Report and Written Opinion received in International App. No. PCT/US2022/040419 dated Nov. 3, 2022.

* cited by examiner

COLD PLATE HAVING OPENING AND RELATED SYSTEMS

CROSS-REFERENCE TO RELATED APPLICATION

This application is a U.S. national phase application under 35 U.S.C. § 371 of International Application No. PCT/US2022/040419, titled "COLD PLATE HAVING OPENING AND RELATED SYSTEMS," filed Aug. 16, 2022, which claims the benefit of U.S. Provisional Patent Application No. 63/260,387, titled "ELECTRONIC ASSEMBLIES AND METHODS OF MANUFACTURING THE SAME," filed Aug. 18, 2021, the disclosures of each of which are incorporated herein by reference in their entities and for all purposes.

BACKGROUND

Technological Field

The present disclosure relates generally to cooling components and electronic assemblies with a cooling component.

Description of the Related Technology

A system on a wafer (SoW) assembly can include a SoW and a heat dissipation structure coupled to the SoW. In some applications, a SoW can include voltage regulating modules (VRMs) and a thermal interface material between the heat dissipation structure and the SoW. A cold plate can be positioned near to the VRMs to cool the VRMs during operation. There are technical challenges related to implementing a cold plate in an electronic assembly with limited area while also providing a desired amount of cooling.

SUMMARY OF CERTAIN INVENTIVE ASPECTS

In one aspect, there is provided a system, comprising: an array of electronic components; a printed circuit board assembly; a cold plate having a plurality of openings therethrough, the cold plate arranged between the array of electronic components and the printed circuit board assembly, and the cold plate configured to cool the array of electronic components; and a plurality of pass through connectors arranged in the openings of the cold plate and configured to connect the array of electronic components to the printed circuit board assembly.

In some embodiments, the cold plate comprises a cold plate body including an array of cooling elements, each of the cooling elements is configured to cool at least one of the electronic components, and each of the cooling elements houses a set of fins.

In some embodiments, the cold plate further comprises an inlet port configured to receive a coolant and an outlet port configured to discharge the coolant.

In some embodiments, the cold plate further comprises: an inlet manifold connected to the inlet port, an outlet manifold connected to the outlet port, and a plurality of flow channels connecting the inlet manifold to the cold plate body and the cold plate body to the outlet manifold.

In some embodiments, the cooling elements are arranged in a plurality of parallel coolant flow paths, each of the flow channels is connected to the cold plate body via a corresponding orifice, and each of the orifices has a diameter to provide a substantially equal flow rate through the parallel coolant flow paths.

In some embodiments, the inlet manifold and the outlet manifold are arranged in a different plane than the cold plate body.

In some embodiments, the fins are arranged in one of the following configurations: in parallel, serpentine, cylindrical, or staggered.

In some embodiments, the pass through connectors comprise pogo pins.

In some embodiments, the pass through connectors are further configured to provide one or more of electrical, thermal, or communication conductivity between the array of electronic components and the printed circuit board assembly.

In some embodiments, the electronic components are voltage regulating modules (VRMs).

In some embodiments, the printed circuit board assembly comprises an array of integrated circuit dies, and the pass through connectors are further configured to connect the array of integrated circuit dies to the array of voltage regulating modules.

In another aspect, there is provided a cold plate for cooling an array of electronic components, the cold plate comprising: a body including an array of cooling elements, wherein the body has a plurality of openings formed therethrough, and each of the openings is configured to receive at least one pass through connector; an inlet port configured to receive a coolant; an inlet manifold configured to receive the coolant from the inlet port; a plurality of inlet channels configured to route the coolant from the inlet manifold to the body; an outlet port configured to discharge the coolant; an outlet manifold configured to route the coolant to the outlet port, and a plurality of outlet channels configured to route the coolant from the body to the outlet manifold.

In some embodiments, the inlet manifold and the outlet manifold are arranged in a different plane than the body.

In yet another aspect, there is provided a cold plate for cooling an array of electronic components, the cold plate comprising: a body including an array of cooling elements, wherein the body has a plurality of openings formed therethrough, and each of the openings is configured to receive at least one pass through connector; an inlet port configured to receive a coolant and provide the coolant to the body; and an outlet port configured to discharge the coolant from the body.

In some embodiments, the cold plate further comprises: an inlet manifold configured to receive the coolant from the inlet port; a plurality of inlet channels configured to route the coolant from the inlet manifold to the body; an outlet manifold configured to route the coolant to the outlet port; and a plurality of outlet channels configured to route the coolant from the body to the outlet manifold, wherein the inlet manifold and the outlet manifold are arranged in a different plane than the body.

In some embodiments, each of the cooling elements is configured to cool a corresponding electronic component arranged adjacent to the cooling element.

In some embodiments, each of the cooling elements houses a set of fins configured to increase heat transfer to the coolant.

In some embodiments, the fins are arranged in one of the following configurations: in parallel, serpentine, cylindrical, or staggered.

In some embodiments, the cooling elements are arranged in a plurality of parallel coolant flow paths, each of the inlet channels is connected to the body via a corresponding orifice, and each of the orifices has a diameter to provide a substantially equal flow rate through the parallel coolant flow paths.

In still yet another aspect, there is provided a system comprising: an electronic component;

a cold plate having an opening therethrough and configured to cool the electronic component; and a pass through connector extending through the opening and electrically connected to the electronic component.

In some embodiments, the system further comprises: a printed circuit board assembly arranged such that the cold plate is positioned between the electronic component and the printed circuit board assembly, wherein the pass through connector is configured to electrically connect the electronic component to the printed circuit board assembly.

In some embodiments, the pass through connectors comprise pogo pins.

In some embodiments, the cold plate houses a set of fins.

BRIEF DESCRIPTION OF THE DRAWINGS

Embodiments of this disclosure will now be described, by way of non-limiting example, with reference to the accompanying drawings.

DETAILED DESCRIPTION

Figure 1:
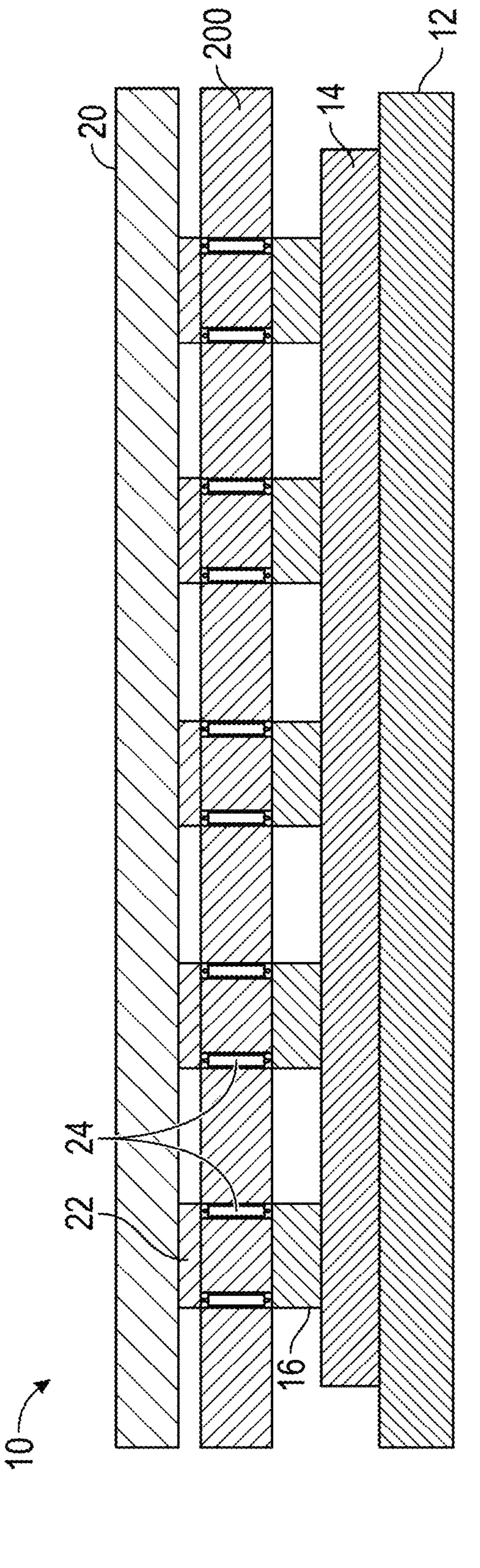
FIG. 1 is a schematic cross sectional side view of a system on a wafer (SoW) assembly coupled to a cold plate with voltage regulating modules (VRMs) on a SoW on one side and a control board on another side.

The following detailed description of certain embodiments presents various descriptions of specific embodiments. However, the innovations described herein can be embodied in a multitude of different ways, for example, as defined and covered by the claims. In this description, reference is made to the drawings where like reference numerals and/or terms can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. The headings provided herein are for convenience only and are not intended to affect the meaning or scope of the claims.

Electrical Connections in Electronic Assemblies

System on a wafer (SoW) assemblies are examples of electronic assemblies. SoW assemblies can include a SoW and a cooling system that is coupled to the SoW. The SoW can include an array of integrated circuit dies. The SoW assembly can include a wafer level packaging structure. The SoW and the cooling system can include an array of electronic components or modules, such as voltage regulating modules (VRMs), positioned therebetween. A thermal interface material (TIM) can be positioned between the electronic components and the cooling system. As discussed below, the cooling system can include a cold plate configured to cool the VRMs.

One or more aspects of the present application correspond to a two-sided cold plate with power and signal delivery systems. Coolant that flows through the microchannels inside the cold plate can enable cooling high power components on both sides of the cold plate. In some embodiments, the cold plate can implement or otherwise incorporate openings or slots that can accommodate pass through connectors, such compliant connectors (e.g., as pogo pins, flexible pins, spring contacts, etc.), sockets and plugs, and/or male and female connectors. Such connectors can be embedded in a housing or magazine that can be press fit in the slots in the cold plate. The assembly method and form factor of pins—as well as their number and dimension—can vary depending on the implementation. The connectors can be used to transfer power and/or data signals through the cold plate between electronic components. In certain embodiments, the cold plate includes inlet and outlet coolant manifolds on two ends.

Cold plates disclosed herein can provide liquid cooling to electronic components on opposing sides of a respective cold plate. For example, a cold plate can provide cooling to both voltage regulating modules on one side of the cold plate and electronic components on a control board on an opposite side of the cold plate. Such a cold plate can also cool pass though connectors between the electronic components on opposing sides, where the pass though connectors are positioned in openings in the cold plate. Cold plates disclosed herein can provide structural stiffness and/or rigidity to a central region of a system on a wafer assembly. Cold plates disclosed herein can be used to cool arrays of electronic components on opposing sides in certain applications. A cold plate in accordance with any suitable principles and advantages disclosed herein can cool an individual electronic component on each opposing side.

Figure 2:
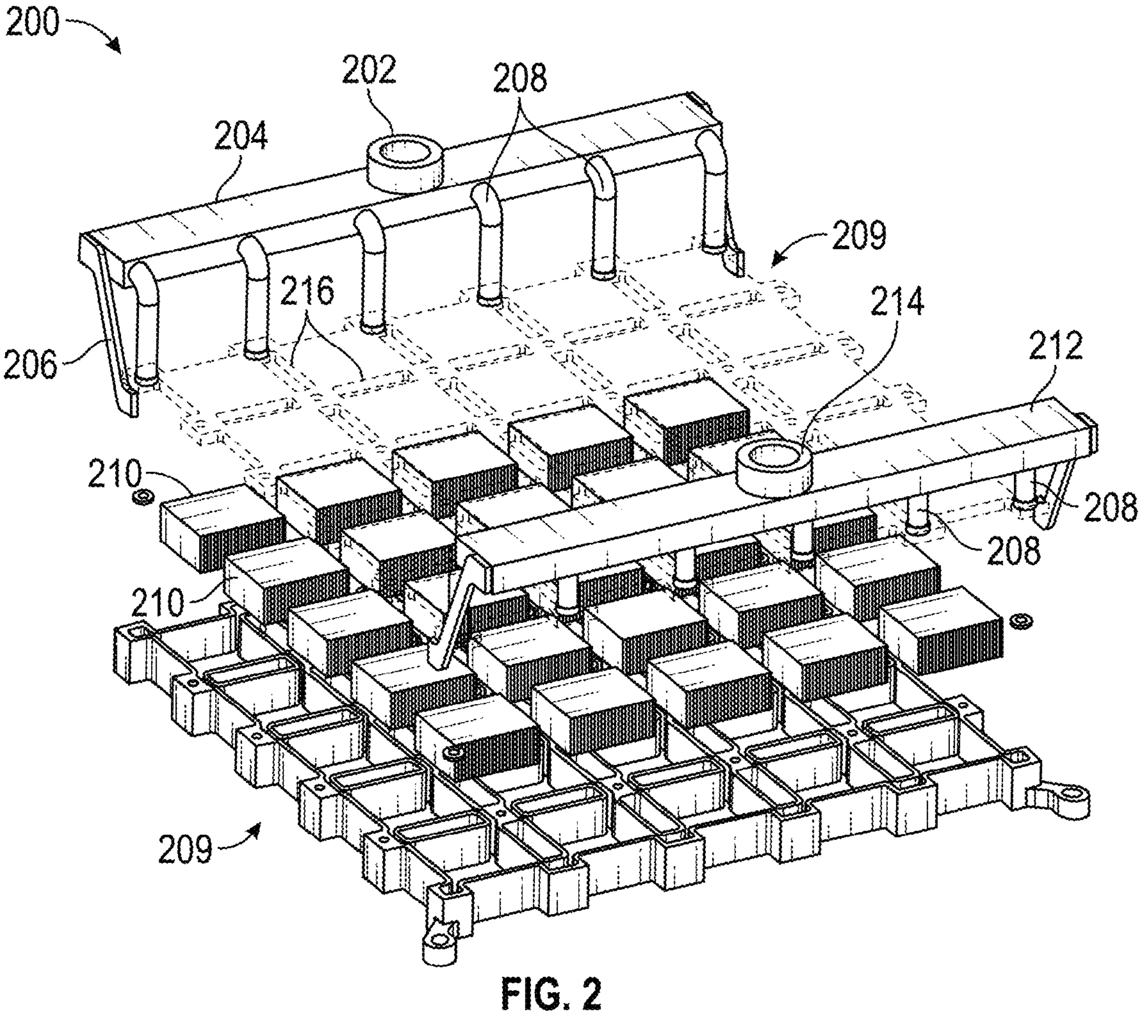
FIG. 2 shows an exploded perspective view of a cold plate in accordance with aspects of this disclosure. In some implementations, the cold plate may be inverted compared to the illustrated view when installed in an electronic assembly.

FIG. 1 is a schematic cross sectional side view of a system on a wafer (SoW) assembly 10 coupled to a cold plate 200 with VRMs 16 on a SoW 14 on one side and a control board 20 on another side. FIG. 2 shows an exploded perspective view of a cold plate 200 in accordance with aspects of this disclosure. In some implementations, the cold plate 200 may be inverted compared to the illustrated view when installed in an electronic assembly 10.

As illustrated in FIG. 1, the SoW assembly 10 includes a heat dissipation structure 12, the SoW 14, VRMs 16, the cold plate 200, and the control board 20. The heat dissipation structure 12 can be a heat sink, a heat spreader, or any other suitable structure to dissipate heat. In some embodiments, the SoW assembly 10 can further include a TIM (not illustrated) between the cold plate 200 and the VRMs 16. The SoW 14 can include an array of integrated circuit dies. A VRM 16 can covert a high voltage, low current to a lower voltage level at a higher current to provide a power supply voltage for an integrated circuit die of the SoW 14. The array of VRMs 16 is one example of an array of electronic components that can be arranged as shown in FIG. 1. The arrangement of FIG. 1 can be applied to a variety of different electronic components.

The control board 20 can include an array of electronic components 22. The control board is an example of a printed circuit board (PCB). In FIG. 1, a printed circuit board assembly includes the control board 20 and the electronic components 22. The electronic components 22 can be control circuits, each configured to control a corresponding one of the VRMs 16. For example, the electronic components 22 can be configured to provide power and/or control signals to the corresponding VRMs 16 to operate the VRMs 16. The cold plate 200 can include a plurality of openings with pass through connectors 24 therein. The pass through connectors 24 can be pogo pins, for example. With the pass through connectors 24 extending through openings in the cold plate 200, the pass though connectors 24 can be included in a central area of the SoW assembly 10. As illustrated, the pass though connectors 24 can be positioned in respective areas corresponding to each integrated circuit die of the SoW 14.

The pass through connectors 24 can electrically connect the electronic components 22 on the control board 20 to the VRMs 16. For example, each of the openings in the cold plate 200 can be configured to receive a plurality of pass through connectors 24, which may be housed in a housing such as a cartridge. The pass through connectors 24 can be configured to connect electric components arranged on opposite sides of the cold plate 200 in order to provide power and/or control signals therebetween.

Cold Plate Designs for Electronic Assemblies

In accordance with more aspects of the present application, the structure of the cold plate 200 of the present application can allow for concurrent efficient cooling and data/power delivery, which enables a compact design. Certain applications have demanding space specifications, such that any space savings within the footprint of the assembly that can be leveraged to improve processing capabilities. For example, in the VRM context, with more of the footprint used by the array VRMs rather than other components, greater compute density and/or processing power can be achieved.

Certain SoW assemblies provide separate physical area on the board for power delivery and/or signal transfer. However, such designs have either (1) limited the cold plate size, which would typically affect the thermal performance and supported power negatively, consequently limiting the overall performance of the system; and/or (2) increased the board area, which would affect the volume efficiency and compactness of the system. Avoiding an increase in the board size can prevent reduced performance due to increased compute latency associated with larger board size. Aspects of this disclosure can solve at least some of these problems by providing cooling as well as power delivery and/or signal transfer though a cold plate without limiting the cold plate size and/or increasing the board area.

Although aspects of this disclosure are described in connection with a SoW assembly 10 including a plurality of VRMs, this disclosure can also be employed in other applications, such as for dense servers, mezzanine boards, etc.

With reference now to FIG. 2, an embodiment of the cold plate 200 of the present application will be described. The illustrated cold plate 200 includes an inlet port 202, inlet manifold 204, mechanical supports 206, flow channels 208, a body 209, fins 210 within the body 209, outlet manifold 212, and an outlet port 214. The cold plate 200 also includes openings 216 (also referred to as receptacles or slots) for pass through connectors (e.g., pogo pins) that provide for thermal, power, and/or communication connectivity through the cold plate 200. In some implementations, the cold plate body 209 may be formed of machined copper parts that have been brazed. The cold plate body 209 can be formed of any other suitable material. The cold plate body 209 can include an array of cooling elements 400 (e.g., as labeled in FIG. 3), each of which encloses one set of fins 210.

Figure 3:
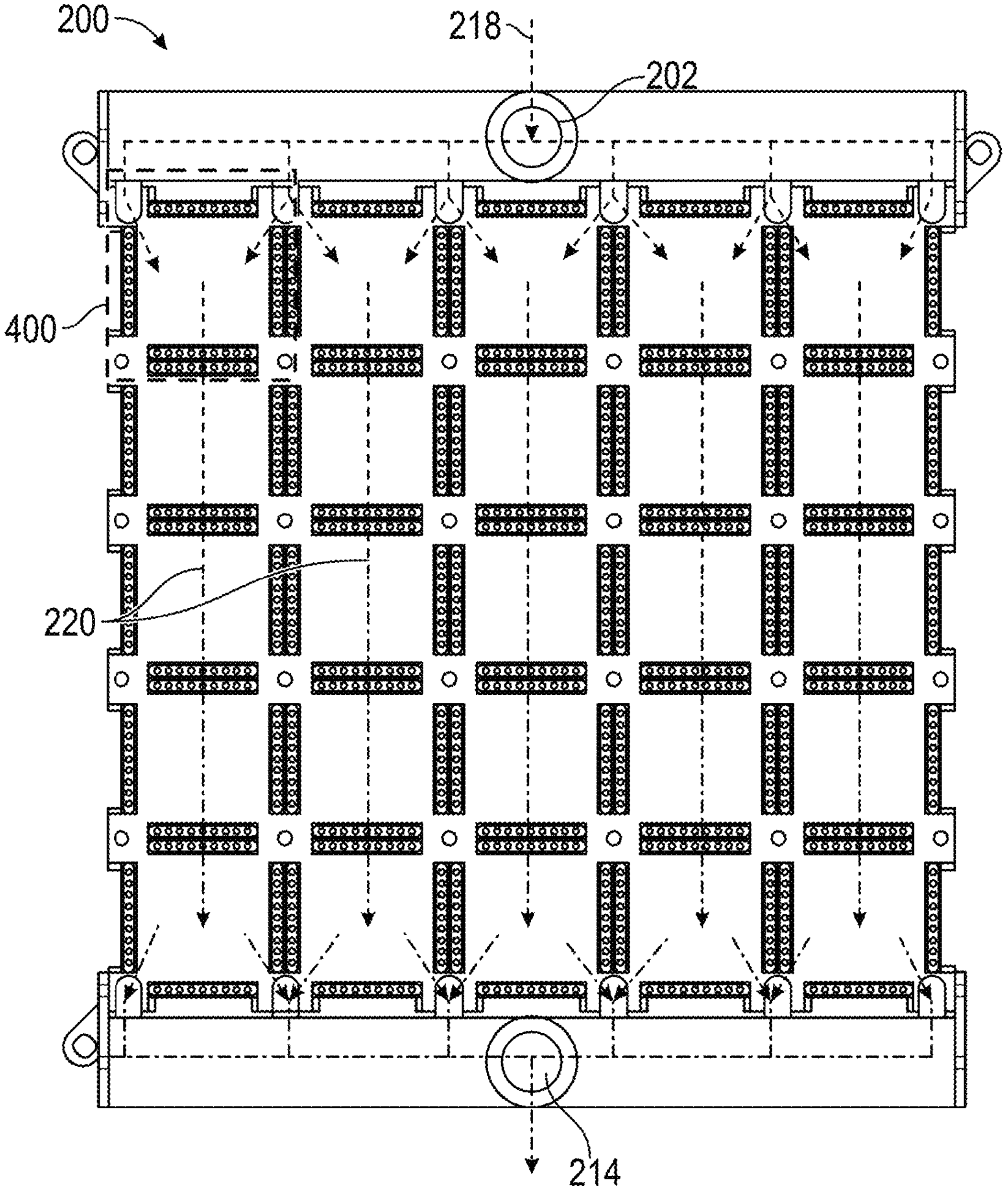
FIG. 3 is a plan view illustrating the flow of coolant through the cold plate of FIG. 2 in accordance with aspects of this disclosure.

FIG. 3 is a plan view illustrating the flow of coolant 218 through the cold plate 200 of FIG. 2 in accordance with aspects of this disclosure. As shown in FIG. 3, in some implementations the cold plate 200 can form a plurality of parallel coolant flow paths 220 through which coolant 218 the can flow. The arrows for the parallel coolant flow paths 220 indicate the general direction of coolant flow, although coolant may flow through corners of cooling elements 400 when flowing between adjacent cooling elements 400 in a coolant flow path. The coolant flow from the inlet port 202 to the outlet port 214 can be controlled for substantially equal distribution using different orifice sizes (see FIGS. 6A and 6B). The inlet manifold 204 together with the flow channels 208 can provide a substantially equal flow of coolant to each of the coolant flow paths 220. The coolant 218 is gradually heated as the coolant cools the adjacent electronic components by flowing through the fins 210 (see FIG. 2). The outlet manifold 212 can route coolant 218 to the output port 214. The coolant 218 can be discharged from the outlet port 214.

FIG. 3 also illustrates how the body 209 of the cold plate 200 is formed as an array of cooling elements 400. With reference to FIGS. 2 and 3, each cooling element 400 includes a portion of the body 209 that defines a volume housing fins 210. In addition, each cooling element 400 is fluidly connected to its adjacent cooling element(s) 400 in the same coolant flow path 220 near the corners of the cooling elements 400 such that the coolant 218 flows around the openings 216 in the cold plate 200.

Figure 4A:
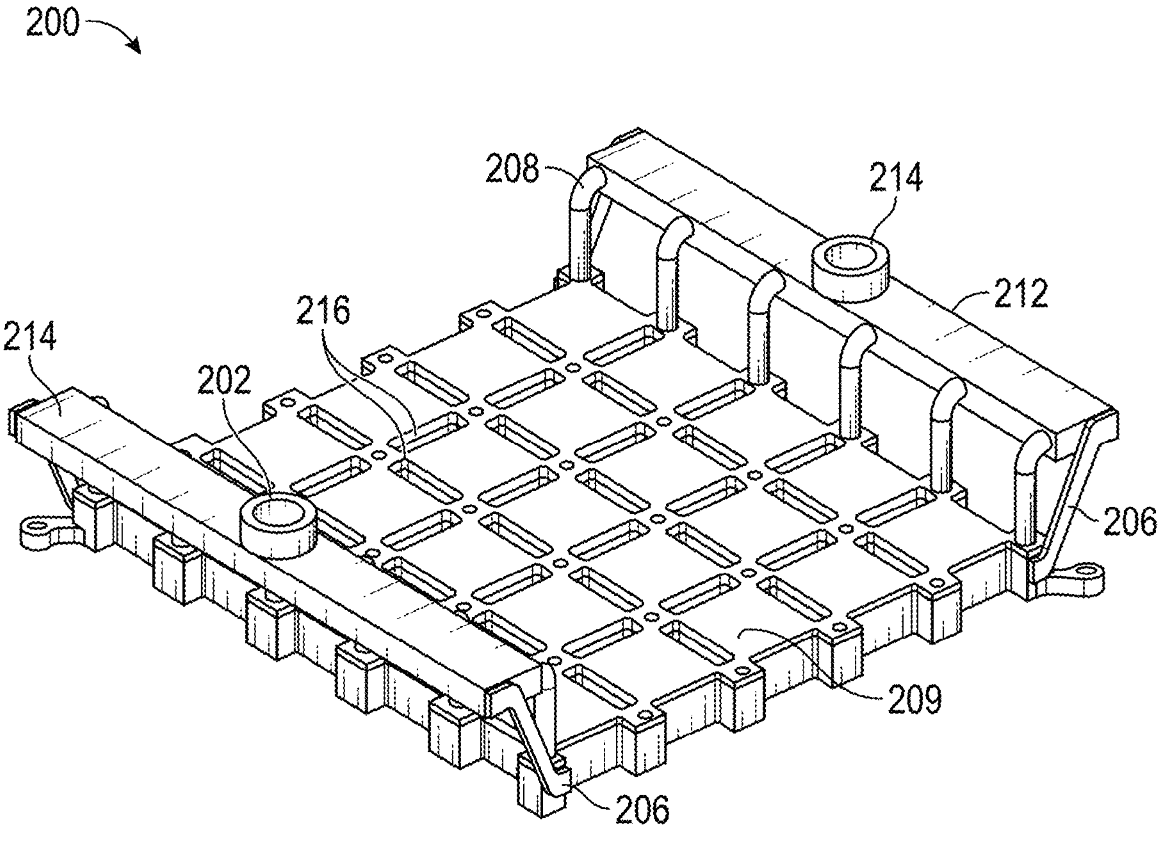
FIGS. 4A-4D illustrate the cold plate in various stages of system assembly with additional components attached thereto.
Figure 4B:
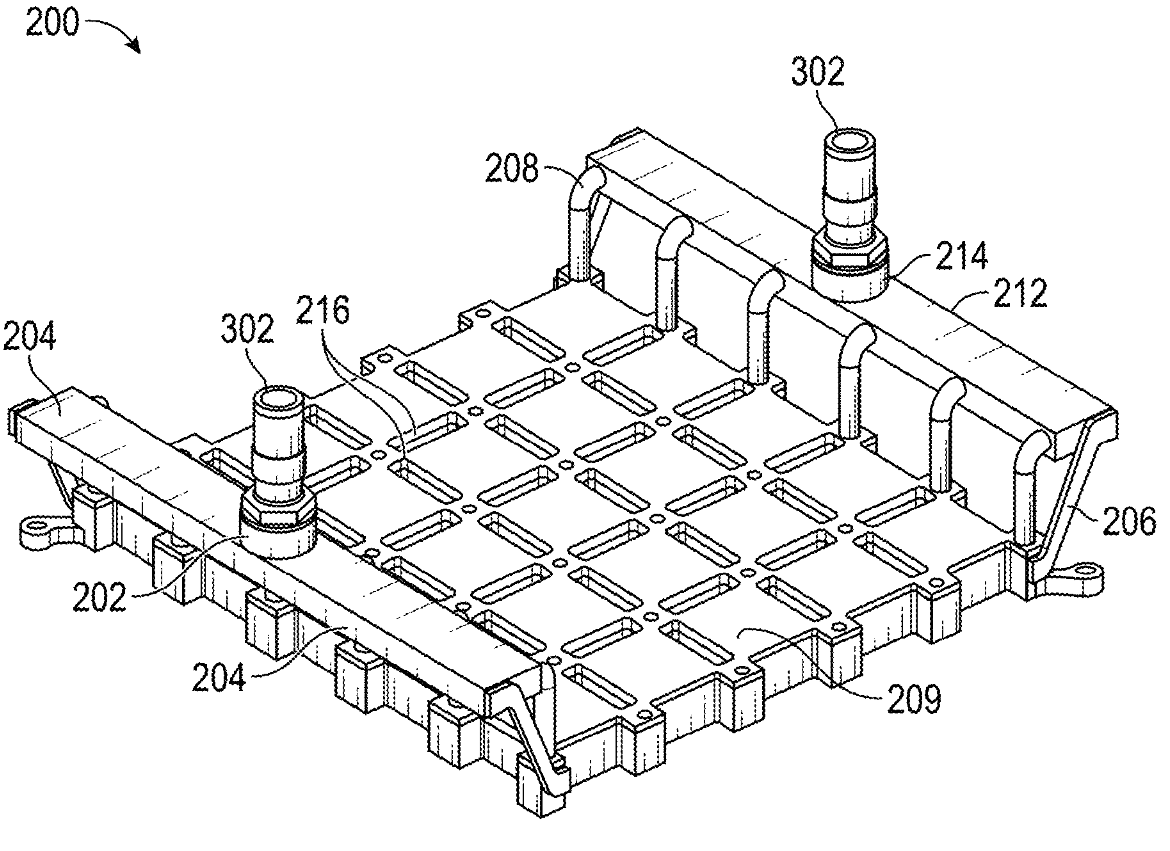
Figure 4C:
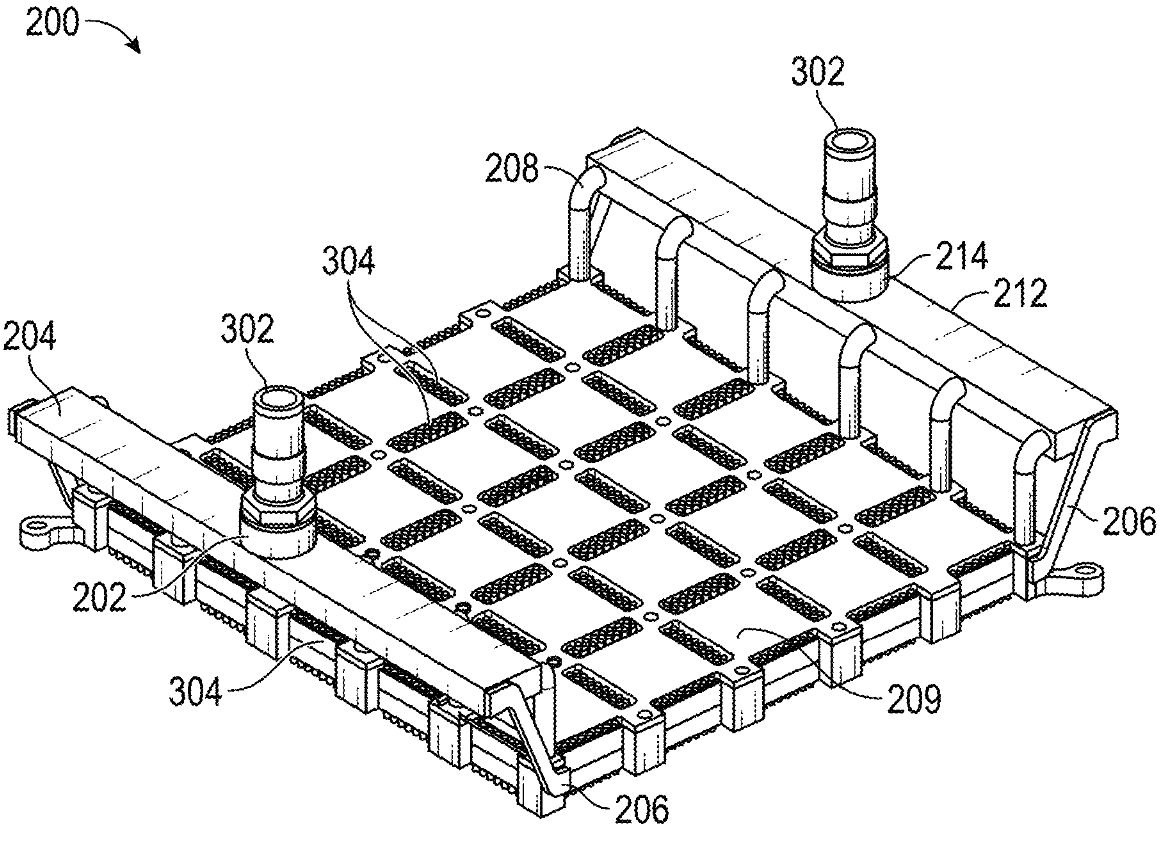
Figure 4D:
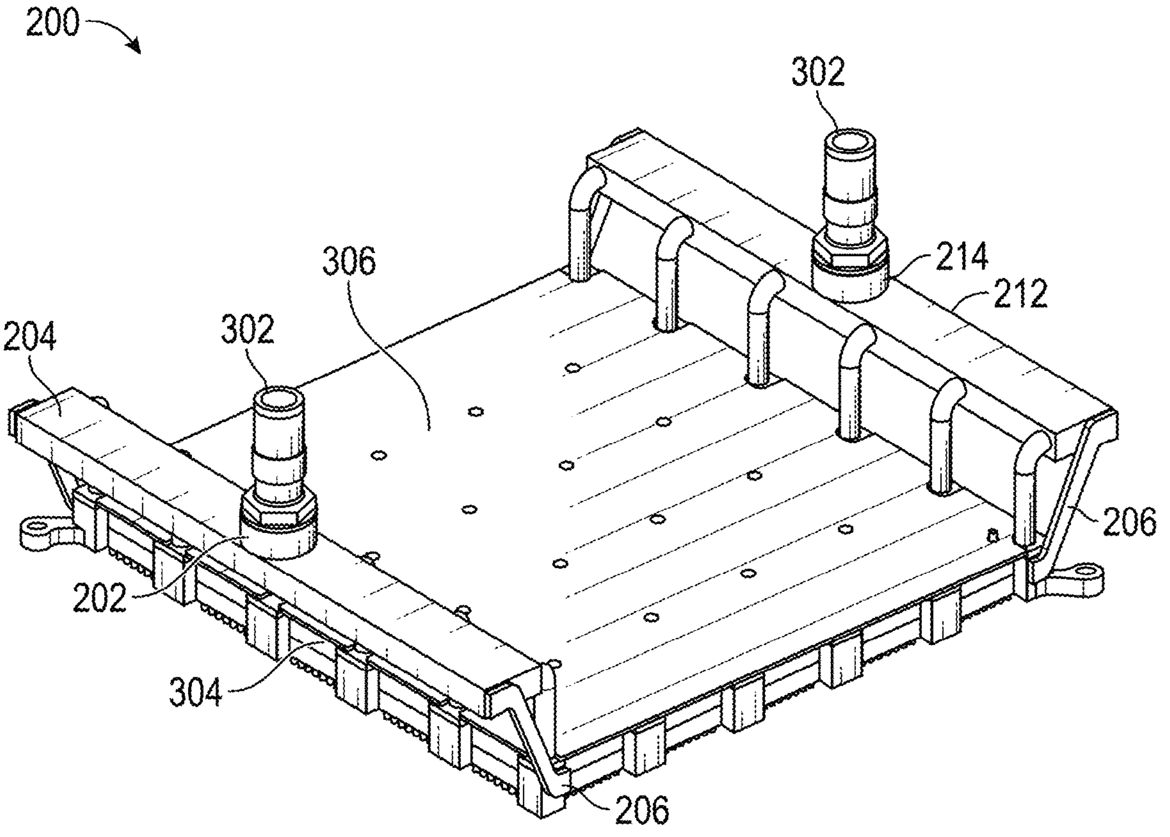

FIGS. 4A-4D illustrate the cold plate 200 in various stages of system assembly with additional components attached thereto. FIG. 4A illustrates the assembled cold plate 200, FIG. 4B illustrates the cold plate 200 with dripless quick disconnects attached to the inlet and outlet, FIG. 4C illustrates connector assemblies installed into the openings in the cold plate 200, and FIG. 4D illustrates a control board attached to one side of the cold plate 200.

With reference to FIGS. 4A-4D, dripless quick disconnects 302 can be respectively attached to each of the inlet port 202 and the outlet port 214. The dripless quick disconnects 302 can simplify the process of attaching the cold plate 200 to a coolant supply/drain. The openings 216 in the cold plate 200 can receive connector housings 304 that are configured to connect an array of electrical components (not illustrated) arranged below the cold plate 200 to a printed circuit board assembly 306. In particular, each of the housings 304 can house a plurality of pass through connectors (e.g., pogo-pins) that provide for thermal, power, and/or communication connectivity between the electrical components and the printed circuit board assembly 306. In certain implementations, the pass through connectors may provide relatively high levels of current such that the pass through connectors generate a significant amount of heat. Thus, the cold plate can also cool the pass through connectors inserted into the openings 216 in the cold plate 200. For example, thermal contact for heat transfer can be created by press fitting the connector housings 304 into the cold plate 200. Also, a thermal interface material can be added between the connector housings 304 and cold plate 200 to improve heat transfer. In some examples, the electrical components may comprise VRMs configured to receive power and control signals from the printed circuit board assembly 306. The printed circuit board assembly 306 can include a printed circuit board, such as a control board, and an array of electronic components on the printed circuit board.

In addition, the inlet manifold 204 and the outlet manifold 212 can be located in a different plane compared to the body 209 of the cold plate 200 as shown in FIGS. 4A-4D. By arranging the inlet and outlet manifolds 204, 212 in a different plane, the overall footprint of the cold plate 200 can be reduced compared to an implementation in which the inlet and outlet manifolds 204, 212 are formed in the same plane as the body 209 of the cold plate 200. Accordingly, aspects of this disclosure can increase the volume efficiency and compactness of the system.

Figure 5A:
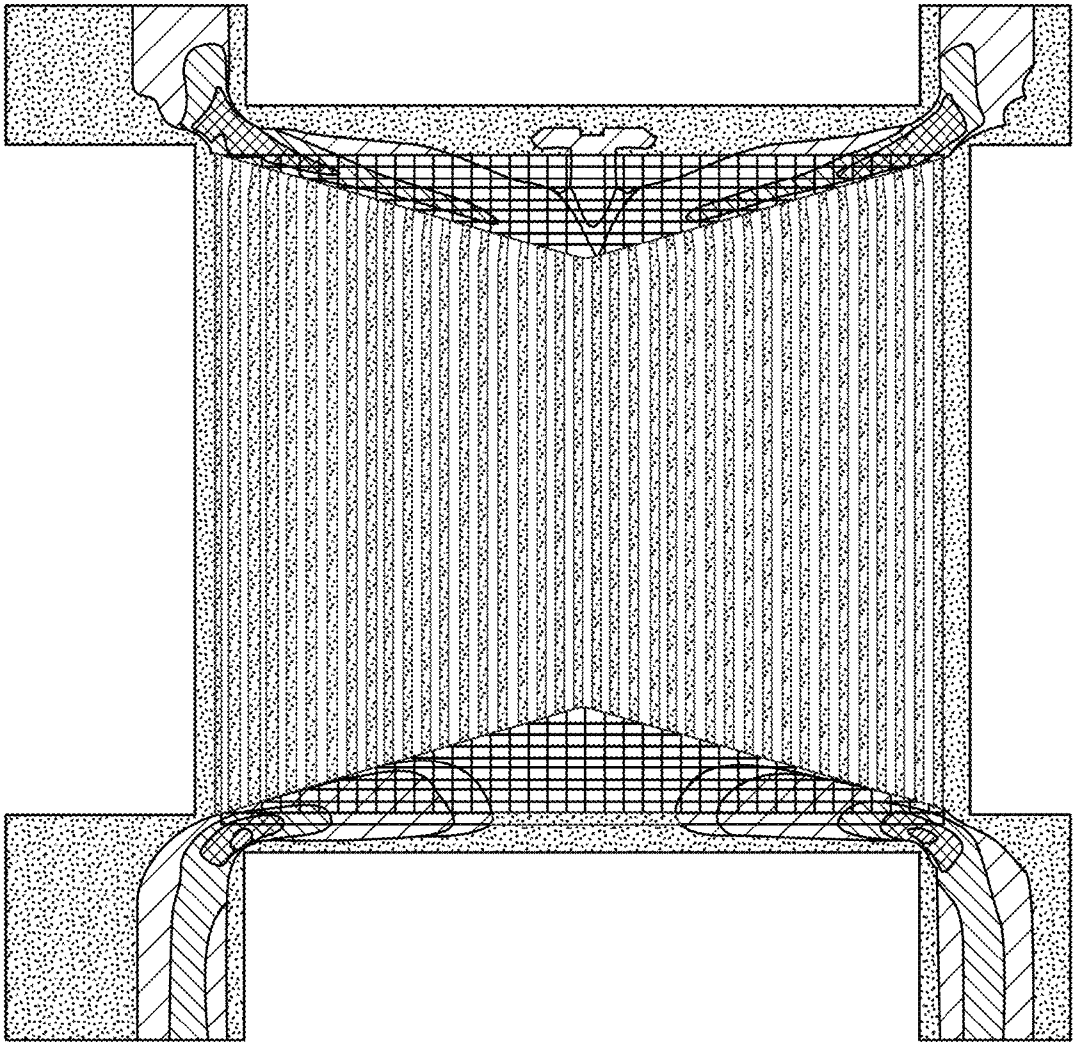
FIGS. 5A-5D each illustrate heat maps associated with various embodiments for the fins within one element of the cold plate array of FIG. 2.
Figure 5B:
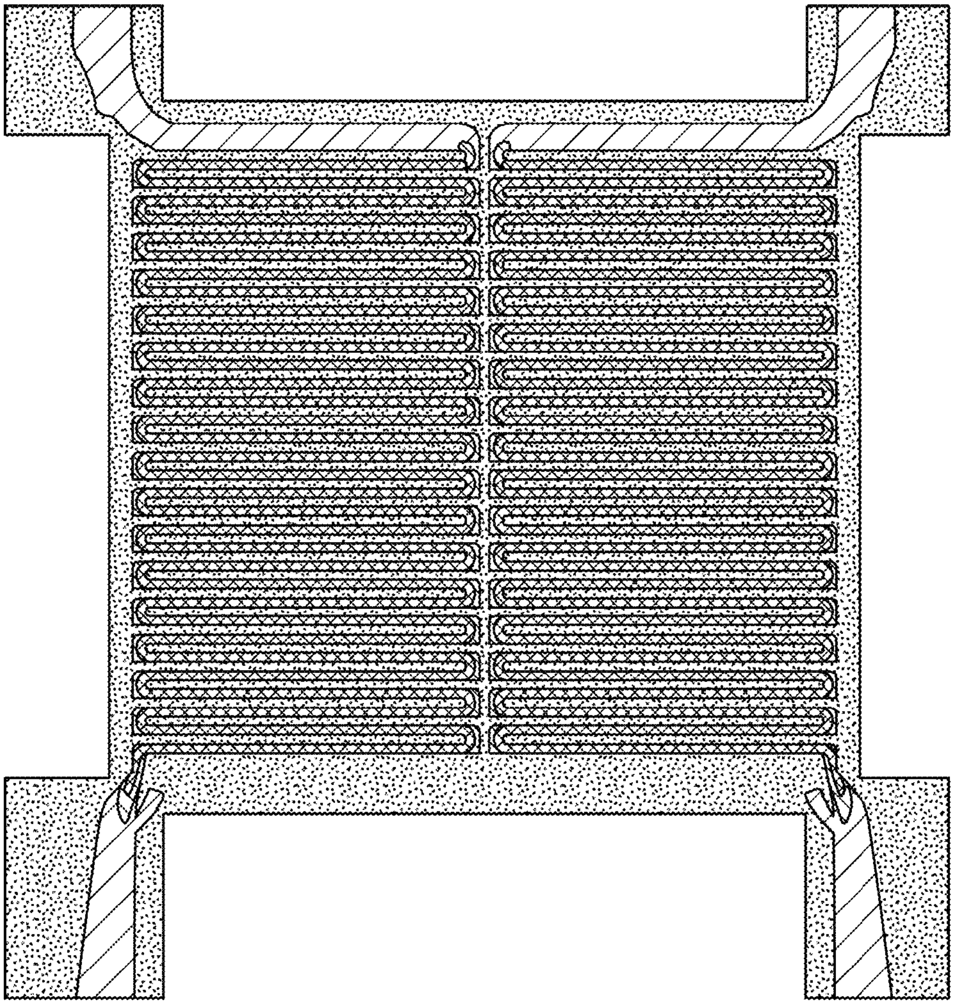
Figure 5C:
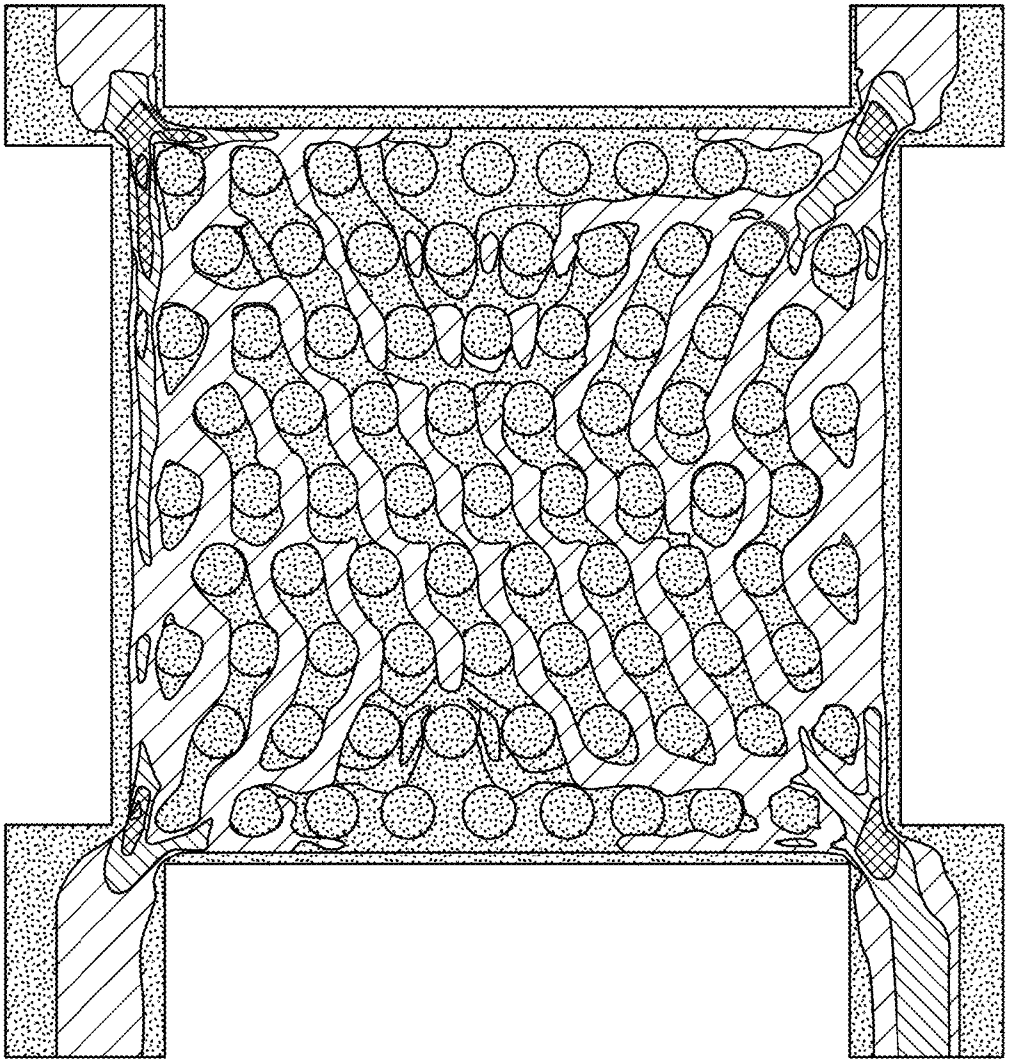
Figure 5D:
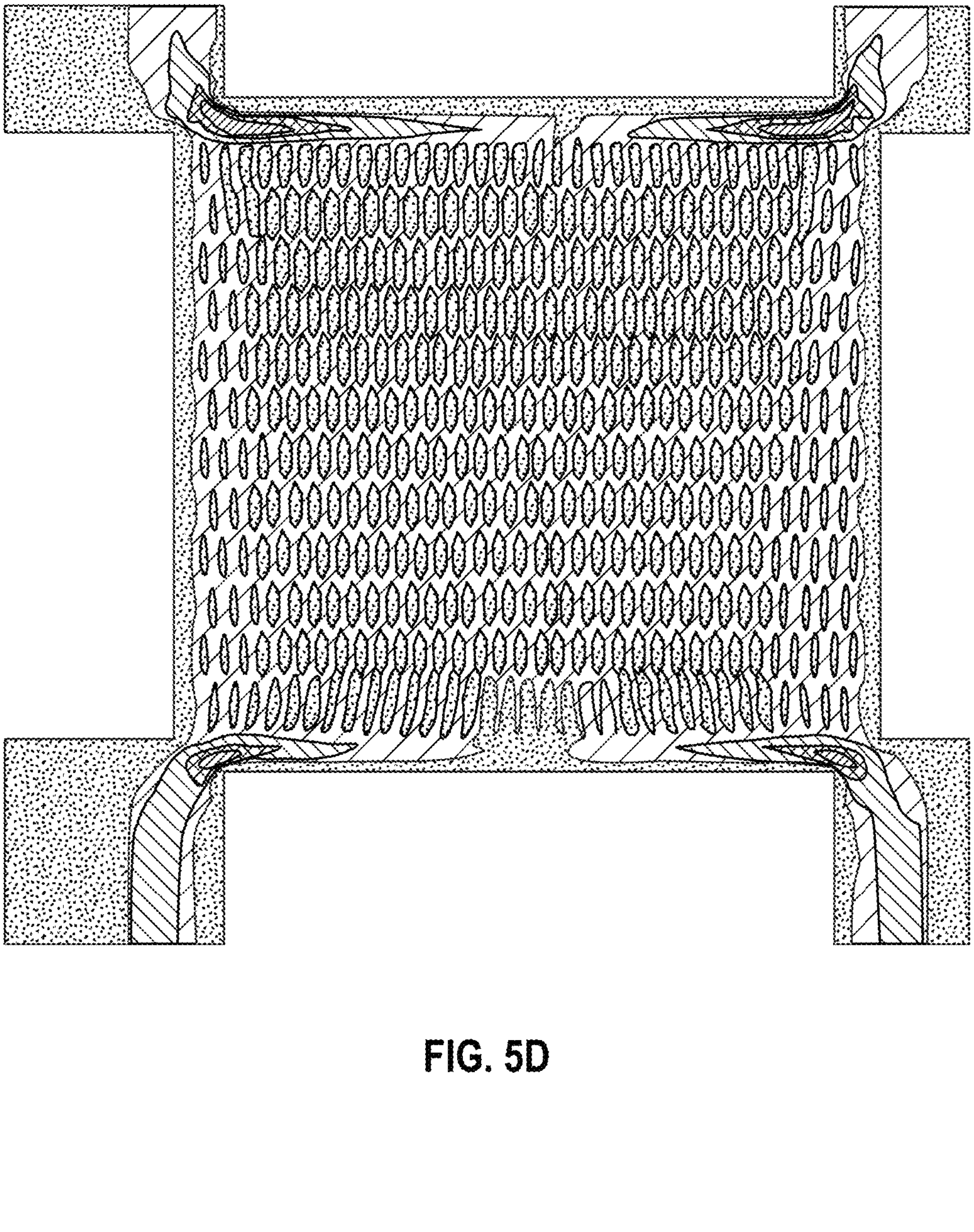

FIGS. 5A-5D each illustrate various heat maps for embodiments for the fins 210 within one cooling element 400 of the cold plate 200 array of FIG. 2. In FIG. 5A, the fins 210 are arranged in parallel with each other. FIG. 5B illustrates a serpentine fin 210 arrangement. FIG. 5C shows an embodiment in which the fins 210 are cylindrical. FIG. 5D illustrates an embodiment where the fins 210 are staggered.

Depending on the embodiment, the cold plate 200 and fins 210 are designed to increase heat transfer to the coolant 218 and decrease the flow rate of the coolant 218. In some embodiments, the heat transfer to the coolant 218 may be greater than a threshold heat transfer rate and the flow rate of the coolant may be less than a threshold flow rate. The cold plate 200 also includes flow paths near the corner of each cooling element 400 that connect the elements forming the parallel coolant flow paths 220 (see FIG. 3).

Figure 6A:
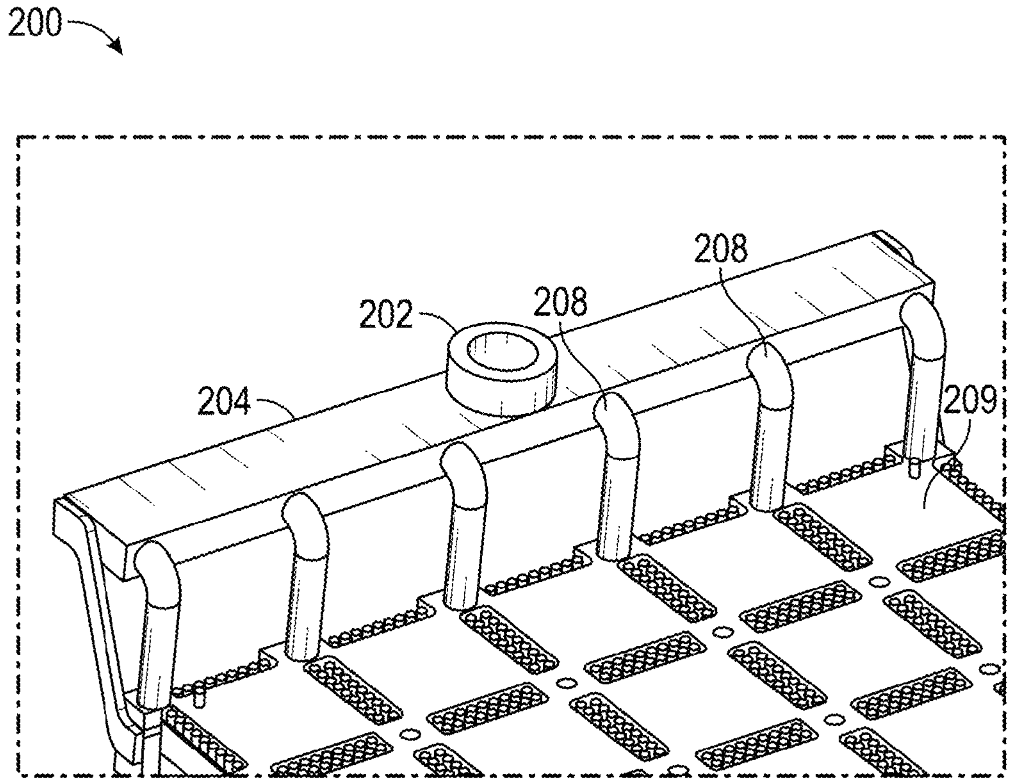
FIGS. 6A and 6B illustrate an inlet manifold and the flow of coolant through the inlet manifold and flow channels in accordance with aspects of this disclosure.
Figure 6B:
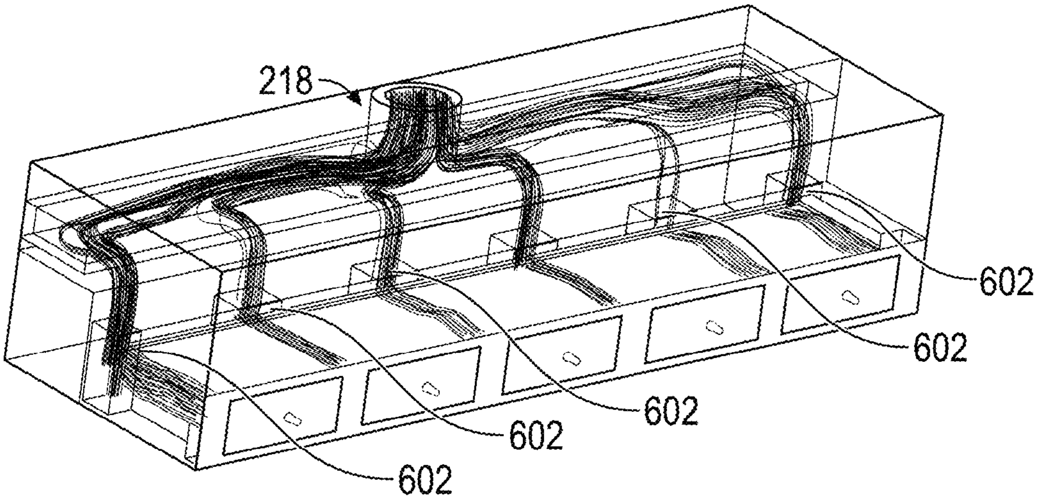

FIGS. 6A and 6B illustrate an inlet manifold 204 and the flow of coolant 218 through the inlet manifold 204 and flow channels 208 in accordance with aspects of this disclosure. FIG. 6A shows an enlarged view of the inlet port 202, the inlet manifold 204, and the flow channels 208 of the cold plate 200. FIG. 6B illustrates the flow of coolant 218 through the inlet port 202, the inlet manifold 204, and the flow channels 208 shown in FIG. 6A. Each of the flow channels 208 is connected to the body 209 of the cold plate 200 via a corresponding orifice 602. In some embodiments, the orifices 602 have different sizes (e.g., diameters) to control the flow rate of coolant 218 through each of the orifices 602. For example, the pressure of the coolant 218 may drop for flow paths that are further away from the inlet port 202, and thus, the diameters of the orifices 602 may increase as the distance of the orifices 602 from the inlet port 202 increases. In some embodiments, the diameters of the orifices 602 are selected to provide a substantially equal flow rate through each parallel coolant flow path 220. Accordingly, sizes of orifices 602 can equalize flow rate through parallel coolant flow paths 220 in the cold plate 200.

Figure 7:
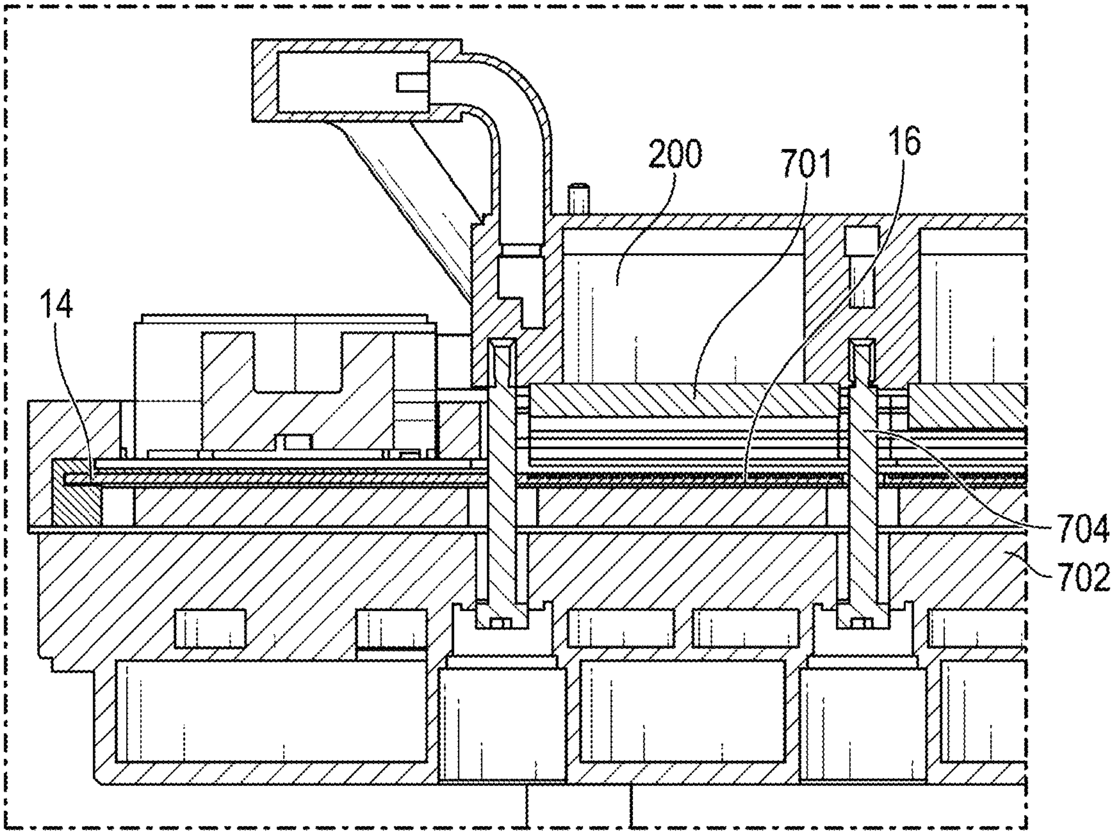
FIG. 7 illustrates a cross-sectional view of a portion of the SoW assembly including the cold plate in accordance with aspects of this disclosure.

FIG. 7 illustrates a cross-sectional view of a portion of the SoW assembly including the cold plate 200 in accordance with aspects of this disclosure. With reference to FIG. 7, the cold plate 200 is attached to the array of VRMs 16. A TIM 701 is located over each VRM 16 between the VRM 16 and the cold plate 200. The VRMs 16 are arranged on the SoW 14, which in turn is coupled to a heat dissipation structure 702. The cold plate 200 can be attached to the heat dissipation structure 702 via a plurality of bolts 704 extending through the SoW 14. The TIM 701 can reduce the heat transfer resistance between the VRMs 16 and the cold plate 200.

Figure 8:
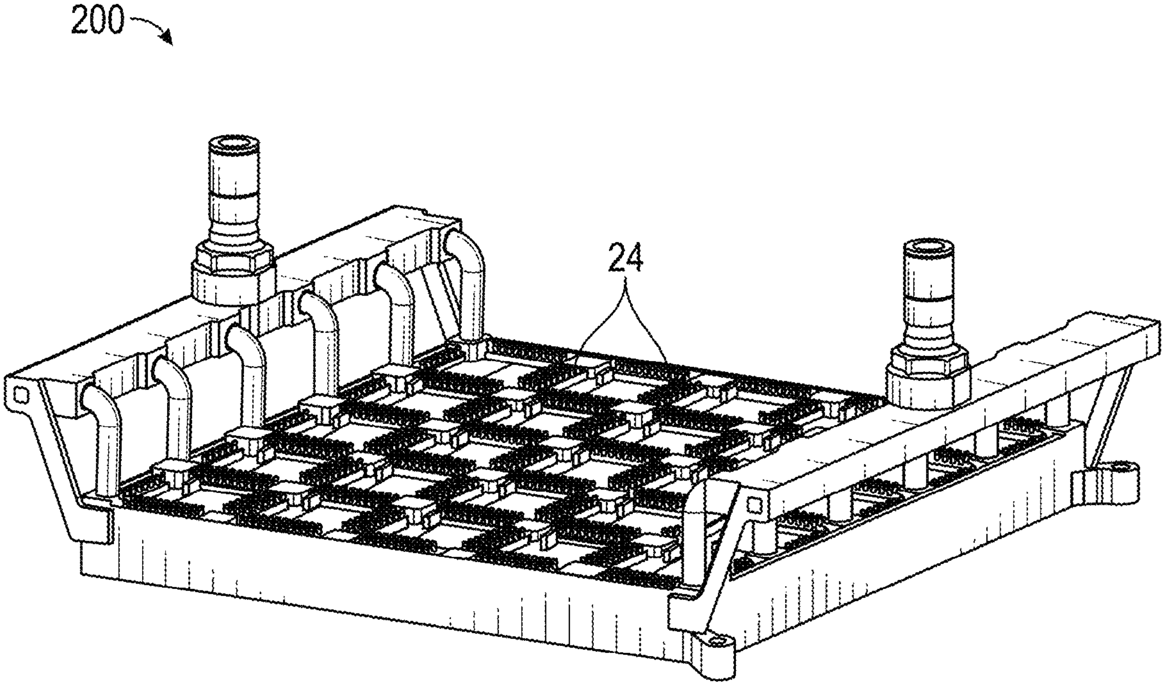
FIG. 8 is a perspective view of the cold plate including a plurality of pass through connectors arranged in the openings in the cold plate in accordance with aspects of this disclosure.

FIG. 8 is a perspective view of the cold plate 200 including a plurality of pass through connectors 24 arranged in the openings in the cold plate 200 in accordance with aspects of this disclosure. In the illustrated embodiment, the pass through connectors 24 are implemented as pogo pins which are housed in cartridges. The pogo pins can be used to provide power and/or communication connectivity to connect the VRMs 16 to the control board 20 (e.g., as shown in FIG. 1).

Figure 9:
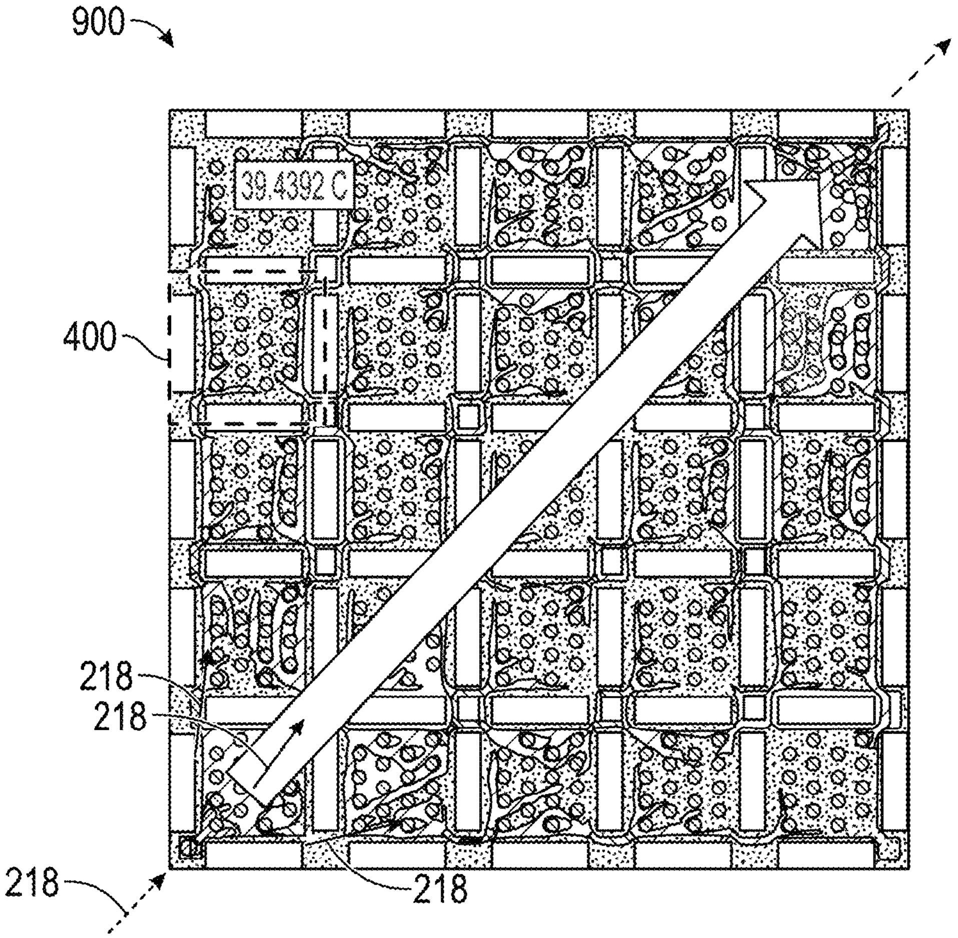
FIG. 9 is a plan view illustrating coolant flow through a cold plate according to embodiment.

FIG. 9 is a plan view illustrating the flow of coolant 218 through a cold plate 900 according to an embodiment. In contrast to the embodiment of FIG. 3, the cold plate 900 is without manifolds. The cold plate 900 is formed of a plurality of cooling elements cooling elements 400, each of which is fluidly connected to all of its adjacent cooling elements 400. Thus, rather than forming a plurality of parallel coolant flow paths 220, the coolant 218 can flow both vertically and horizontally to create a substantially diagonal flow through the cold plate 900. In some implementations, each of the cooling elements 400 may enclose a set of pin fins to further facilitate diagonal flow. In one embodiment, the fins may be distributed in a substantially uniform manner to increase performance.

Since the coolant 218 flows between opposite corners of the cold plate 900, the cold plate 200 can be implemented without manifolds (e.g., see the inlet manifold 204 and the outlet manifold 212 of FIG. 2). This reduced the size of the cold plate 900 and reduces the assembled complexity compared to the manifold design. However, the cold plate 200 having manifolds may achieve increased cooling compared to the manifold free design 900 in certain applications.

Any suitable principles and advantages disclosed herein can be applicable to wafer level packaging and/or high density multiple die packaging. Though the embodiments disclosed herein used VRMs as an example, any suitable electrical module, component, die, chip, or the like may be mounted on a wafer and utilize any suitable principles and advantages disclosed herein. Any suitable combination of features of two or more embodiments disclosed herein can be implemented.

The SoW assemblies disclosed herein can be included in a processing system. Features of this disclosure, such as any of the features of the cold plates disclosed herein, can be implemented in any suitable processing system. The processing system can include the SoW assembly 10 of FIG. 1, for example. The processing system can have a high compute density and can dissipate heat generated by the processing system. The processing system can execute trillions of operations per second in certain applications. The processing system can be used in and/or specifically configured for high performance computing and/or computation intensive applications, such as neural network training and/or processing, machine learning, artificial intelligence, or the like. The processing system can implement redundancy. In some applications, the processing system can be used to perform neural network training to generate data for an autopilot system for vehicle (e.g., an automobile), other autonomous vehicle functionality, or Advanced Driving Assistance System (ADAS) functionality.

In addition, while aspects of this disclosure are described in connection with an array of electronic components, aspects of this disclosure can be applied a cold plate configured to cool a single electronic component on one side. For example, a cold plate configured to cool an electronic component can include one or more openings formed therethrough. The opening(s) can receive one or more pass through connectors configured to provide thermal, power, and/or communication connectivity between the electronic component and a printed circuit board or other electronic component, where the cold plate is arranged between the electronic component and the printed circuit board or other electronic component.

CONCLUSION

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

The foregoing description has been described with reference to specific embodiments. However, the illustrative discussions above are not intended to be exhaustive or to limit the inventions to the precise forms described. Many modifications and variations are possible in view of the above teachings. Others skilled in the art are thereby enabled to best utilize the techniques and various embodiments with various modifications as suited to various uses.

Although the disclosure and examples have been described with reference to the accompanying drawings, various changes and modifications will become apparent to those skilled in the art. Such changes and modifications are to be understood as being included within the scope of the disclosure.

What is claimed is:

1. A system, comprising:

an array of electronic components;

a printed circuit board assembly;

a cold plate having a plurality of openings therethrough, the cold plate arranged between the array of electronic components and the printed circuit board assembly, and the cold plate configured to cool the array of electronic components; and a plurality of pass through connectors arranged in the plurality of openings of the cold plate, each of the pass through connectors configured to electrically connect a corresponding one of the electronic components to the printed circuit board assembly, wherein the cold plate is further configured to cool the pass through connectors via thermal contact with the pass through connectors.

2. The system of claim 1, wherein:

the cold plate comprises a cold plate body including an array of cooling elements, each of the cooling elements is configured to cool at least one of the electronic components, and each of the cooling elements houses a set of fins.

3. The system of claim 2, wherein the cold plate further comprises an inlet port configured to receive a coolant and an outlet port configured to discharge the coolant.

4. The system of claim 3, wherein the cold plate further comprises:

an inlet manifold connected to the inlet port, an outlet manifold connected to the outlet port, and a plurality of flow channels connecting the inlet manifold to the cold plate body and the cold plate body to the outlet manifold.

5. The system of claim 4, wherein:

the cooling elements are arranged in a plurality of parallel coolant flow paths, each of the flow channels is connected to the cold plate body via a corresponding orifice, and each of the orifices has a diameter to provide a substantially equal flow rate through the parallel coolant flow paths.

6. The system of claim 4, wherein the inlet manifold and the outlet manifold are arranged in a different plane than the cold plate body.

7. The system of claim 3, wherein the fins are arranged in one of the following configurations: in parallel, serpentine, cylindrical, or staggered.

8. The system of claim 1, wherein the pass through connectors comprise pogo pins.

9. The system of claim 1, wherein the pass through connectors are further configured to provide one or more of electrical, thermal, or communication conductivity between the corresponding electronic component and the printed circuit board assembly.

10. The system of claim 1, wherein the electronic components are voltage regulating modules (VRMs).

11. The system of claim 10, wherein:

the printed circuit board assembly comprises an array of integrated circuit dies, and the pass through connectors are further configured to connect the array of integrated circuit dies to the array of voltage regulating modules.

12. The system of claim 1, wherein the thermal contact between the cold plate and the pass through connectors is created by press fitting the pass through connectors into the openings of the cold plate.

13. The system of claim 1, further comprising a thermal interface material arranged between the pass through connectors and the openings of the cold plate.

14. The system of claim 1, wherein the array of electronic components is formed on a wafer.

15. A cold plate for cooling an array of electronic components, the cold plate comprising:

a body including an array of cooling elements, wherein the body has a plurality of openings formed therethrough, and each of the openings is configured to receive at least one pass through connector, wherein each of the pass through connectors is configured to electrically connect a corresponding one of the electronic components to a printed circuit board assembly;

an inlet port configured to receive a coolant and provide the coolant to the body; and an outlet port configured to discharge the coolant from the body, wherein the cold plate is configured to cool the array of electronic components, wherein the cold plate is further configured to cool the pass through connectors via thermal contact with the pass through connectors.

16. The cold plate of claim 15, further comprising:

an inlet manifold configured to receive the coolant from the inlet port;

a plurality of inlet channels configured to route the coolant from the inlet manifold to the body;

an outlet manifold configured to route the coolant to the outlet port; and a plurality of outlet channels configured to route the coolant from the body to the outlet manifold, wherein the inlet manifold and the outlet manifold are arranged in a different plane than the body.

17. The cold plate of claim 16, wherein:

the cooling elements are arranged in a plurality of parallel coolant flow paths, each of the inlet channels is connected to the body via a corresponding orifice, and each of the orifices has a diameter to provide a substantially equal flow rate through the parallel coolant flow paths.

18. The cold plate of claim 15, wherein each of the cooling elements is configured to cool a corresponding electronic component arranged adjacent to the cooling element.

19. The cold plate of claim 15, wherein each of the cooling elements houses a set of fins configured to increase heat transfer to the coolant.

20. A system comprising:

an array of electronic components;

a printed circuit board assembly;

a cold plate having a plurality of openings therethrough and configured to cool the electronic components; and a plurality of pass through connectors extending through the openings and electrically connecting a corresponding one of the electronic components to the printed circuit board assembly, wherein the cold plate is further configured to cool the pass through connectors via thermal contact with the pass through connectors.

21. The system of claim 20, wherein the pass through connectors comprise pogo pins.

* * * * *